United States Patent
Lin et al.

(10) Patent No.: US 8,803,235 B2
(45) Date of Patent: Aug. 12, 2014

(54) LATERAL-DIFFUSED METAL OXIDE SEMICONDUCTOR DEVICE (LDMOS) AND FABRICATION METHOD THEREOF

(71) Applicant: United Microelectronics Corp., Hsin-Chu (TW)

(72) Inventors: An-Hung Lin, New Taipei (TW); Hong-Ze Lin, Hsinchu (TW); Bo-Jui Huang, Hsinchu (TW); Wei-Shan Liao, Yunlin County (TW); Ting-Zhou Yan, Kaohsiung (TW); Kun-Yi Chou, New Taipei (TW); Chun-Wei Chen, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/044,885

(22) Filed: Oct. 3, 2013

(65) Prior Publication Data

US 2014/0035034 A1 Feb. 6, 2014

Related U.S. Application Data

(62) Division of application No. 13/105,912, filed on May 12, 2011, now Pat. No. 8,581,338.

(51) Int. Cl.
*H01L 29/78* (2006.01)

(52) U.S. Cl.
USPC .... 257/335; 257/337; 257/343; 257/E29.256; 257/E21.417

(58) Field of Classification Search
USPC ............... 257/337, 343, 492, E29.256, 335, 257/E21.417
See application file for complete search history.

(56) References Cited

U.S. PATENT DOCUMENTS

| | | | |
|---|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |
| 6,165,846 A | 12/2000 | Carns |
| 6,245,689 B1 | 6/2001 | Hao |

(Continued)

*Primary Examiner* — Mamadou Diallo
(74) *Attorney, Agent, or Firm* — Winston Hsu; Scott Margo

(57) ABSTRACT

A lateral-diffused metal oxide semiconductor device (LDMOS) includes a substrate, a first deep well, at least a field oxide layer, a gate, a second deep well, a first dopant region, a drain and a common source. The substrate has the first deep well which is of a first conductive type. The gate is disposed on the substrate and covers a portion of the field oxide layer. The second deep well having a second conductive type is disposed in the substrate and next to the first deep well. The first dopant region having a second conductive type is disposed in the second deep well. The doping concentration of the first dopant region is higher than the doping concentration of the second deep well.

15 Claims, 6 Drawing Sheets

(56) References Cited

U.S. PATENT DOCUMENTS

| | | |
|---|---|---|
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0186467 A1 | 8/2006 | Pendharkar |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0008710 A1 | 1/2009 | Wei |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2011/0057263 A1 | 3/2011 | Tang |
| 2011/0079849 A1 | 4/2011 | Yan |
| 2011/0198927 A1 | 8/2011 | Korec |
| 2011/0248782 A1 | 10/2011 | Kondo |
| 2012/0187483 A1 | 7/2012 | Yang |

LATERAL-DIFFUSED METAL OXIDE SEMICONDUCTOR DEVICE (LDMOS) AND FABRICATION METHOD THEREOF

CROSS REFERENCE TO RELATED APPLICATIONS

This application is a divisional application of and claims the benefit of U.S. patent application Ser. No. 13/105,912, filed May 12, 2011.

BACKGROUND OF THE INVENTION

1. Field of the Invention

The present invention is related to a lateral-diffused metal oxide semiconductor device and fabrication method thereof, and more specifically, to a lateral-diffused metal oxide semiconductor device and fabrication method thereof having a low On-state resistance/breakdown voltage (R/B) ratio.

2. Description of the Prior Art

As manufacturing techniques for semiconductor integrated circuits progress, it is preferable to have controllers, memories and devices for low-voltage operation and power devices for high-voltage operation integrated in one single-chip system. Prior art devices employ an insulated gate bipolar transistor (IGBT) and double-diffused metal oxide semiconductor (DMOS) transistor devices as the power devices of high-voltage operation in the single-chip system.

The DMOS transistor device can be categorized into lateral DMOS (LDMOS) and vertical DMOS (VDMOS) devices. Due to their advantages of higher operational bandwidth, higher operational efficiency, and convenience of integration with other devices such as CMOS devices due to their planar structure, LDMOS devices are more widely used.

FIG. 1 schematically depicts a cross-sectional view of a conventional lateral-diffused metal oxide semiconductor device. As shown in FIG. 1, a lateral-diffused metal oxide semiconductor device 100 includes a P-type substrate 110, an N-type well 120 disposed in the substrate 110, a field oxide layer 130 disposed on the substrate 110, a gate 140 disposed on a portion of the field oxide layer 130, and a spacer 150 disposed beside the gate 140. A P-type dopant region 160 is located in the N-type well 120. The source 170 is located in the P-type dopant region 160 at one side of the spacer 150 and the drain 180 is disposed in the N-type well 120 at the other side of the spacer 150.

As the voltage forced onto the gate 140 of the lateral-diffused metal oxide semiconductor device 100 is higher than the threshold voltage, the lateral-diffused metal oxide semiconductor device 100 turns on. At this time, the high voltage signal inputted to the drain 180 transfers to the source 170 by passing through the N-type well 120. The N-type well 120 is used as a resistance to make the high voltage signal passing through the N-type well 120 drop to a low voltage signal for use in the internal circuits. However, the concentration of the electrical field caused by the sharp doping profile of the interface between the P-type dopant region 160 and the N-type well 120 will lead to low breakdown voltage and high on-state resistance of the lateral-diffused metal oxide semiconductor device 100. As a result, the R/B ratio (On-state resistance/breakdown voltage) of the lateral-diffused metal oxide semiconductor device of the prior art remains at a high level.

Therefore, a lateral-diffused metal oxide semiconductor device is needed for solving the problem of reducing the R/B ratio.

SUMMARY OF THE INVENTION

The present invention provides a lateral-diffused metal oxide semiconductor device and fabrication method thereof having a lower R/B ratio than the prior art.

The present invention provides a lateral-diffused metal oxide semiconductor device including a substrate, a first deep well, at least a field oxide layer, a gate, a second deep well, a first dopant region, a drain and a common source. The substrate comprises the first deep well having a first conductive type. At least a field oxide layer is located on the substrate. The gate is disposed on the substrate and covers a portion of the field oxide layer. The second deep well having a second conductive type is disposed in the substrate next to the first deep well. The first dopant region having a second conductive type is disposed in the second deep well, wherein the doping concentration of the first dopant region is higher than the doping concentration of the second deep well. The drain is disposed in the first deep well outside of the gate. The common source is disposed in the first dopant region inside of the gate.

The present invention provides a lateral-diffused metal oxide semiconductor device including a substrate, an epitaxial layer, a first deep well, an embedded layer, at least a field oxide layer, a gate, a second deep well, a first dopant region, a drain and a common source. The epitaxial layer is located on the substrate, wherein the epitaxial layer includes the first deep well having a first conductive type. The embedded layer is located between the substrate and the epitaxial layer. At least a field oxide layer is located on the epitaxial layer. The gate is disposed on the epitaxial layer and covers a portion of the field oxide layer. The second deep well having a second conductive type is disposed in the epitaxial layer next to the first deep well. The first dopant region having a second conductive type is disposed in the second deep well, wherein the doping concentration of the first dopant region is higher than the doping concentration of the second deep well. The drain is disposed in the first deep well outside of the gate. The common source is disposed in the first dopant region inside of the gate.

The present invention provides a fabricating method of a lateral-diffused metal oxide semiconductor device including the following. A substrate is provided. A first deep well is formed in the substrate, wherein the first deep well has a first conductive type. A second deep well is formed in the substrate next to the first deep well, wherein the second deep well has a second conductive type. A drain is formed in the first deep well. At least a field oxide layer is formed on the substrate. A first dopant region is formed in the second deep well, wherein the first dopant region has a second conductive type and the doping concentration of the first dopant region is higher than the doping concentration of the second deep well. A gate is formed on the substrate between the first dopant region and the drain, wherein the gate covers a portion of the field oxide layer. A common source is formed in the first dopant region.

According to the above, the present invention provides a lateral-diffused metal oxide semiconductor device and fabrication method thereof, which has a second deep well. The doping type of the second deep well and the first dopant region are the same, and the doping concentration of the second deep well is lower than the doping concentration of the first dopant region, thereby the lateral-diffused metal oxide semiconductor device of the present invention has a gradual doping concentration ingredient structure. The R/B ratio of the lateral-diffused metal oxide semiconductor device of the present invention is lower than the prior art. Additionally, the lateral-diffused metal oxide semiconductor device of the present invention has an embedded layer used as an insulating layer for avoiding circuit leakage flowing from the regions above the embedded layer, especially the second deep well.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2B schematically depicts a cross-sectional view of a lateral-diffused metal oxide semiconductor device according to a first preferred embodiment of the present invention.

DETAILED DESCRIPTION

Figure 1:
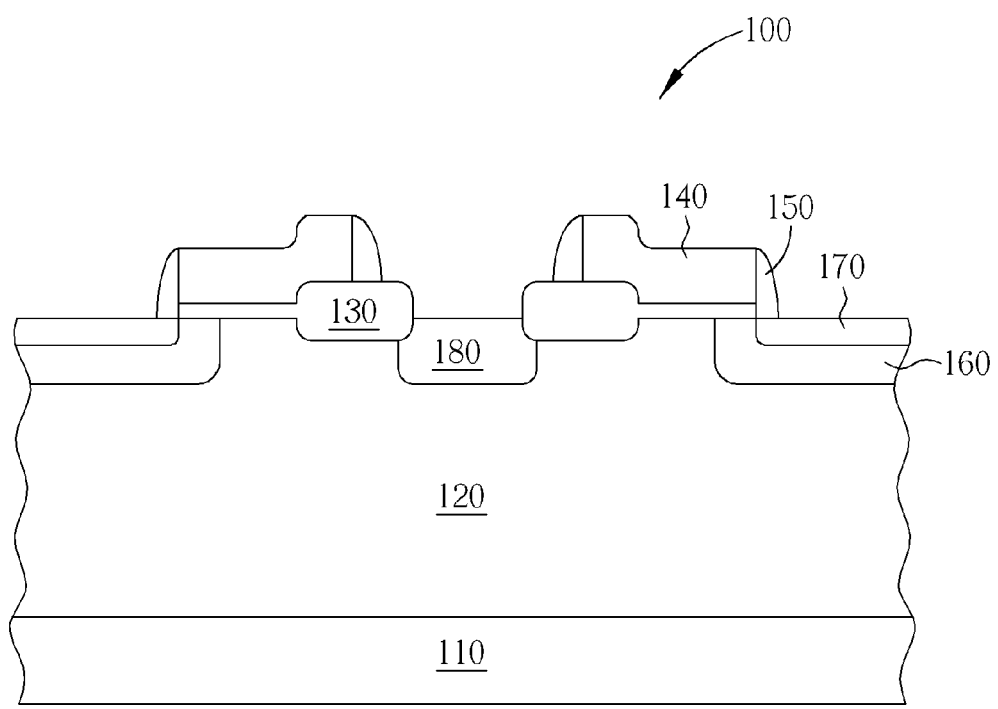
FIG. 1 schematically depicts a cross-sectional view of a conventional lateral-diffused metal oxide semiconductor device.
Figure 2:
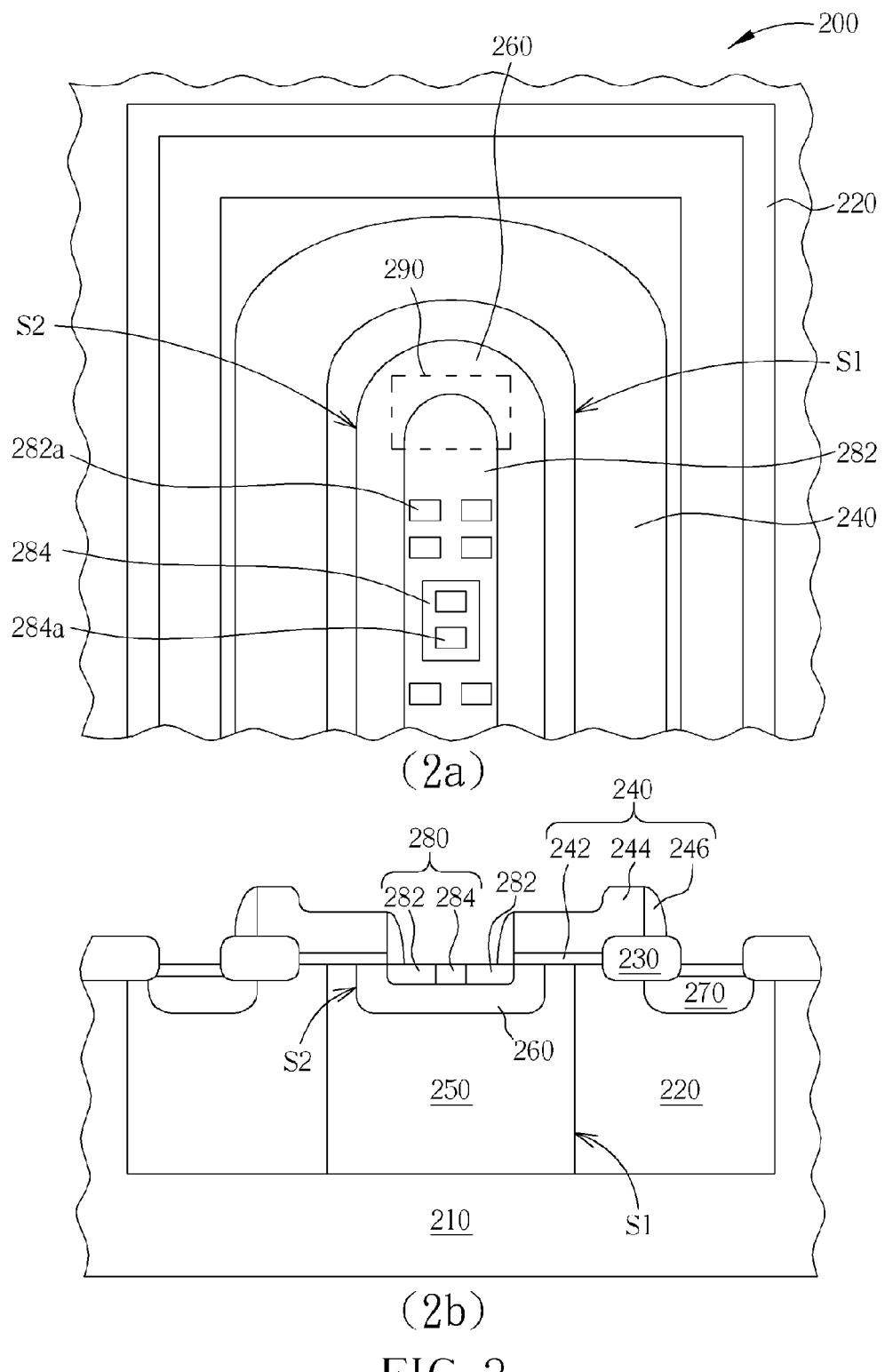
FIG. 2 schematically depicts a top view and a cross-sectional view of a lateral-diffused metal oxide semiconductor device according to a first preferred embodiment of the present invention, wherein FIG. 2A schematically depicts a top view of a lateral-diffused metal oxide semiconductor device according to a first preferred embodiment of the present invention.

FIG. 2A schematically depicts a top view of a lateral-diffused metal oxide semiconductor device according to a first preferred embodiment of the present invention. FIG. 2B schematically depicts a cross-sectional view of a lateral-diffused metal oxide semiconductor device according to a first preferred embodiment of the present invention. As shown in FIG. 2A and FIG. 2B, a lateral-diffused metal oxide semiconductor device 200 includes a substrate 210, a first deep well 220, at least a field oxide layer 230, a gate 240, a second deep well 250, a first dopant region 260, a drain 270 and a common source 280. The substrate 210 has a first deep well 220, wherein the substrate 210 includes a silicon substrate, a silicon containing substrate, a silicon-on-insulator (SOI) substrate, or other semiconductor substrates. The field oxide layer 230 is located on the substrate 210, wherein the field oxide layer 230 includes a silicon dioxide layer, and an insulating structure such as a shallow trench isolation (STI), but it is not limited thereto. The gate 240 is disposed on the substrate 210 and covers a portion of the field oxide layer 230, wherein the gate 240 includes a gate dielectric layer 242, a gate electrode 244 and a spacer 246. Furthermore, the gate 240 may also include a capping layer (not shown). The materials of the gate 240 are known in the art and therefore are not described herein.

The first deep well 220 is a first conductive type and the second deep well 250 is a second conductive type disposed in the substrate 210 next to the first deep well 220. In this embodiment, the first deep well 220 surrounds the second deep well 250, and the first deep well 220 and the second deep well 250 do not overlap with each other, but it is not limited thereto. The substrate 210 is preferred to be of a second conductive type. In this embodiment, the first conductive type is an N-type and the second conductive type is a P-type, in another embodiment, the first conductive type is a P-type while the second conductive type is an N-type. The first dopant region 260 also being a second conductive type is disposed in the second deep well 250, and the doping concentration of the first dopant region 260 is higher than the doping concentration of the second deep well 250, thereby forming a gradual doping concentration ingredient structure. The common source 280 is disposed in the first dopant region 260 inside the gate 240 and the drain 270 is disposed in the first deep well outside the gate 240. That is, the drain 270 is disposed next to the field oxide layer 230. Therefore, the breakdown of the lateral-diffused metal oxide semiconductor device 200 caused by currents passing through the gate dielectric layer 242 to the gate electrode 244 can be avoided as the currents driven by high voltage flow into the drain 270. Furthermore, applying the common source 280 and the drain 270 disposed surrounding the gate 240 can attain a uniform electrical field, thereby enhancing the breakdown voltage.

It should be noted that the gate 240 in a preferred embodiment of the present invention has a racetrack shaped layout (as shown in the top view of FIG. 2), wherein the gate 240 is composed of a pair of lines parallel with each other and a pair of curved ends respectively disposed at the two ends of the lines. In another embodiment, the gate 240 may also have a rectangular and hollow layout, but is not limited thereto. In a preferred embodiment, a dopant region 290 having a second conductive type is also included, which is located in the substrate 210 at the two ends of the common source 280. The position range of the dopant region 290 corresponds to and partially overlaps the curved ends of the gate 240 and the common source 280. The dopant region 290 can avoid channels generating in the curved ends, thereby avoiding the generated electrical field. The interface S1 between the second deep well 250 and the first deep well 220 includes a racetrack shaped layout surface, which is similar to the surface of the racetrack shaped layout of the gate 240. In a preferred embodiment, the interface S1 between the second deep well 250 and the first deep well 220 is located right below the gate 240. In other words, the interface S1 between the second deep well 250 and the first deep well 220 is located between the drain 270 and the common source 280. Furthermore, the interface S2 between the first dopant region 260 and the second deep well 250 also includes a racetrack shaped layout surface. The interface S2 between the second deep well 250 and the first dopant region 260 is preferably located directly below the gate 240. In other words, the interface S2 between the second deep well 250 and the first dopant region 260 is located between the drain 270 and the common source 280, and the interface S1 surrounds the interface S2. In this way, the distribution of the internal voltage while the lateral-diffused metal oxide semiconductor device 200 is turned on can be controlled by adjusting the concentration of the first dopant region 260, the second deep well 250 and the first deep well 220, meaning the breakdown voltage of the lateral-diffused metal oxide semiconductor device 200 increases and the on-state resistance of the lateral-diffused metal oxide semiconductor device 200 decreases. For example, the doping concentration of the first dopant region 260 is higher than the doping concentration of the second deep well 250, so that the doping concentration of the first dopant region 260 and the second deep well 250 has a gradual doping concentration ingredient. The problem concerning the concentration of the electrical field is improved, hence increasing the breakdown voltage of the lateral-diffused metal oxide semiconductor device 200 and decreasing the on-state resistance of the lateral-diffused metal oxide semiconductor device 200. As a result, the R/B ratio decreases and the electrical performance of the lateral-diffused metal oxide semiconductor device 200 is improved.

In a preferred embodiment, only the second deep well 250 is disposed between the first deep well 220 and the first dopant region 260. That is, there will not be any components disposed between the first deep well 220 and the first dopant region 260, thereby avoiding the problems of the disordered distribution of the electrical field or the concentration of the electrical field, which can lead to low breakdown voltage or high on-state resistance.

Moreover, the drain 270 disposed in the first deep well outside the gate 240 also has a racetrack shaped layout surface. The common source 280 is disposed in the first dopant region 260 inside the gate 240. In a circuit layout design, the common source 280 is surrounded by the gate 240 and the common source 280 is a boat-shaped structure having a racetrack shaped layout surface. The common source 280 further includes a second dopant region 282 and a plurality of island-shaped third dopant region 284, and the second dopant region 282 and the island-shaped third dopant region 284 respectively are a first conductive type and a second conductive type. In a preferred embodiment, the doping concentration of the second deep well 250, the first dopant region 260 and the island-shaped third dopant region 284 from high to low is the island-shaped third dopant region 284, the first dopant region 260 and the second deep well 250, thereby a gradual doping concentration ingredient structure is provided to improve the electrical distribution of the lateral-diffused metal oxide semiconductor device 200 and decrease the R/B ratio of the lateral-diffused metal oxide semiconductor device 200. Furthermore, a plurality of body contact plugs 284a may be disposed on the island-shaped third dopant region 284, and a plurality of source contact plugs 282a may be disposed on the second dopant region 282, to electrically connect other electrical devices.

Figure 3:
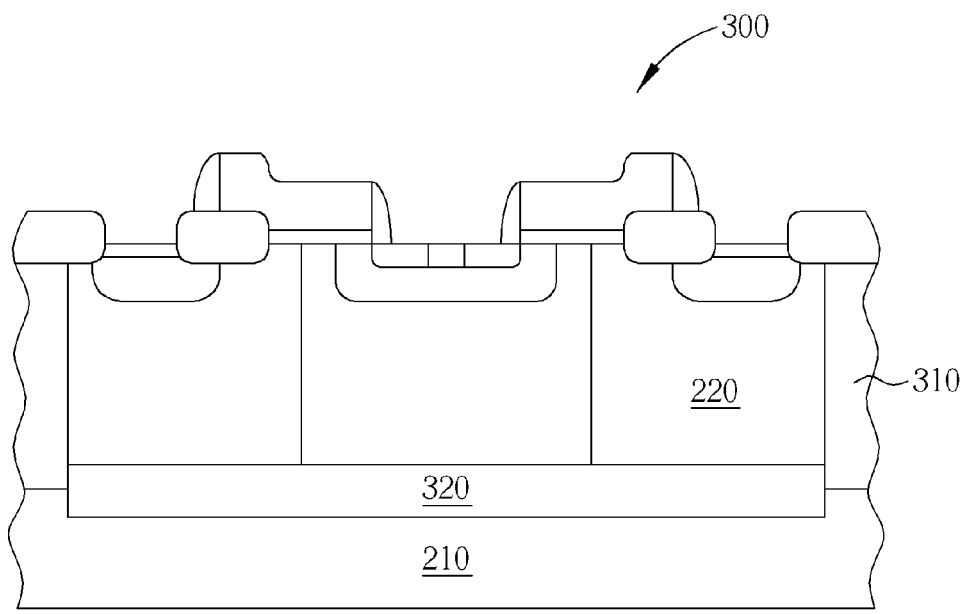
FIG. 3 schematically depicts a cross-sectional view of a lateral-diffused metal oxide semiconductor device according to a second preferred embodiment of the present invention.

FIG. 3 schematically depicts a cross-sectional view of a lateral-diffused metal oxide semiconductor device according to a second preferred embodiment of the present invention. As shown in FIG. 3, the difference between this embodiment from the first embodiment is: the lateral-diffused metal oxide semiconductor device 300 includes an epitaxial layer 310 located on the substrate 210 and the first deep well 220 having a first conductive type is located in the epitaxial layer 310. The lateral-diffused metal oxide semiconductor device 300 further includes an embedded layer 320 located between the substrate 210 and the epitaxial layer 310 to electrically isolate the second deep well 250 above the embedded layer 320, for avoiding circuit leakage caused by circuits from the second deep well 250 flowing downward. The embedded layer 320 may be a heavily doped region, an N+ embedded layer, or an insulating layer such as an oxide layer, but is not limited thereto. In another embodiment, the lateral-diffused metal oxide semiconductor device 300 may only include an embedded layer 320 located in the substrate 210, and exclude the epitaxial layer 310.

FIGS. 4-10 schematically depict a cross-sectional view of a fabricating method of a lateral-diffused metal oxide semiconductor device according to a preferred embodiment of the present invention. One lateral-diffused metal oxide semiconductor device is used as an example for describing the fabricating method of the lateral-diffused metal oxide semiconductor device below and shown in FIGS. 4-10; however, the present invention is not limited to applying to one lateral-diffused metal oxide semiconductor device. For example, other devices such as other low voltage transistors may also be fabricated paired with the lateral-diffused metal oxide semiconductor device. In the following embodiment, N-type is seen as the first conductive type and P-type is seen as the second conductive type, but it is known in the art that P-type can also be seen as the first conductive type while N-type can be seen as the second conductive type.

Figure 4:
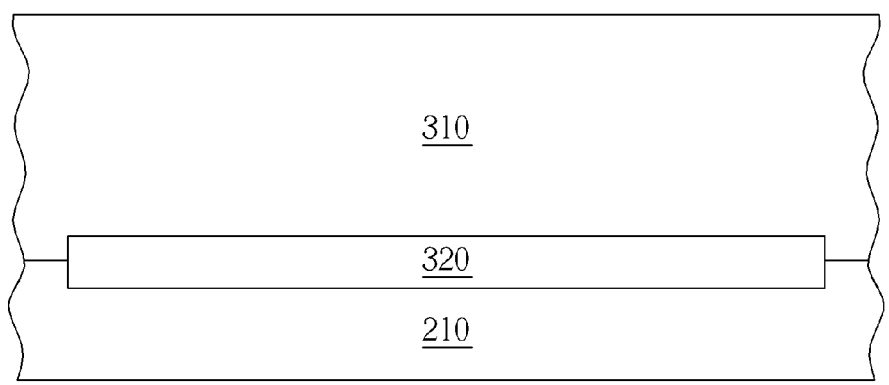
FIG. 4 schematically depicts a cross-sectional view of a fabricating method of a lateral-diffused metal oxide semiconductor device according to a preferred embodiment of the present invention.

As shown in FIG. 4, a substrate 210 is provided, wherein the substrate 210 may be a semiconductor substrate such as a silicon substrate, a silicon-containing substrate, or a silicon-on-insulator substrate. The substrate 210 may be a P-type substrate, and an embedded layer 320 is selectively formed in the substrate 210. The embedded layer 320 may be an N+ heavily doped region formed by an N+ heavily doped ion implantation process, or an oxide insulating layer formed by a thermal oxidation process, but is not limited thereto. An epitaxial layer 310 is formed on the substrate 210 after the embedded layer 320 is formed, wherein the epitaxial layer 310 may be formed by epitaxial process. However, in another embodiment, the substrate 210 may be a silicon-on-insulator (SOI) substrate composing a silicon-oxide layer-silicon structure. Therefore, the oxide layer can be the embedded layer 320, and the upper silicon can correspond to the epitaxial layer 310. The present invention can also be applied to a silicon substrate 210, where the embedded layer 320 or the epitaxial layer 310 is not further formed as described in the structure of the first embodiment.

Figure 5:
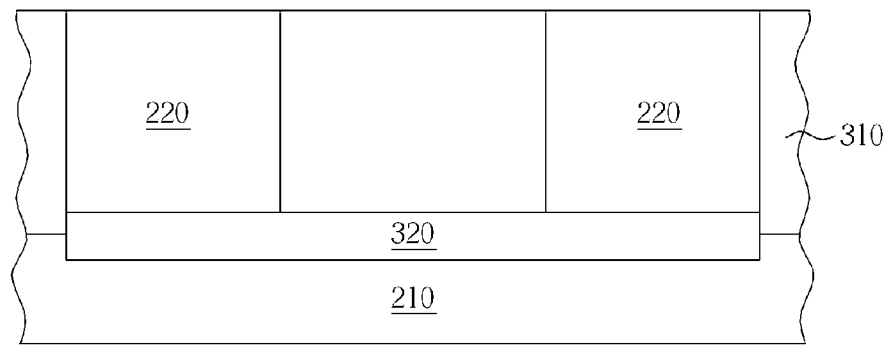
FIG. 5 schematically depicts a cross-sectional view of a fabricating method of a lateral-diffused metal oxide semiconductor device according to a preferred embodiment of the present invention.

As shown in FIG. 5, a first deep well 220 is formed in the epitaxial layer 310, wherein the first deep well 220 may be an N-type deep well formed by implanting N-type dopant into the epitaxial layer 310 applying an ion implantation process, and then driving-in the dopant by performing a thermal treatment process.

Figure 6:
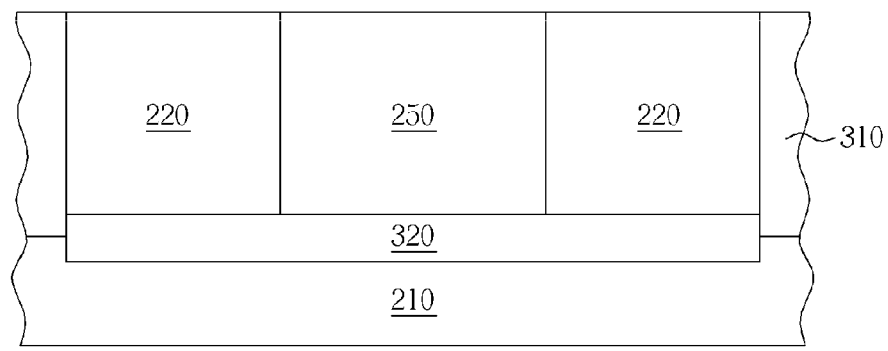
FIG. 6 schematically depicts a cross-sectional view of a fabricating method of a lateral-diffused metal oxide semiconductor device according to a preferred embodiment of the present invention.

As shown in FIG. 6, a second deep well 250 is formed in the epitaxial layer 310 next to the first deep well 220. The second deep well 250 may be a P-type deep well, and the second deep well 250 may be formed by implanting N-type dopant into the first deep well 220 applying an ion implantation process, and then driving-in the dopant by performing a thermal treatment process.

Figure 7:
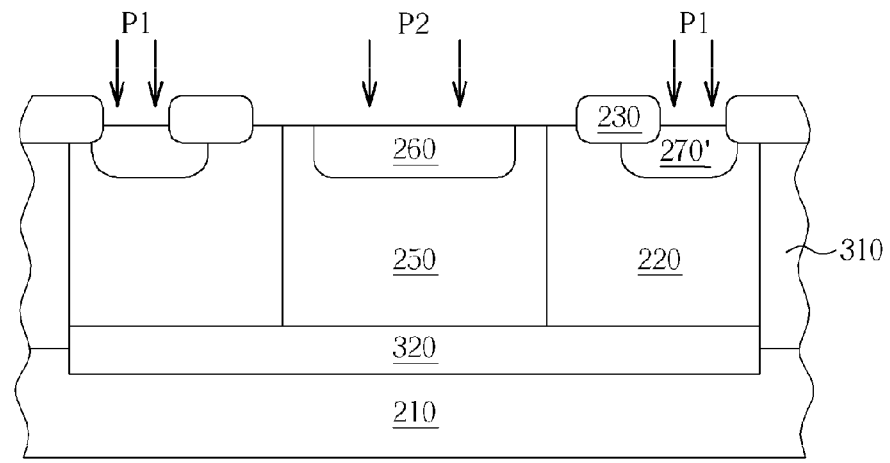
FIG. 7 schematically depicts a cross-sectional view of a fabricating method of a lateral-diffused metal oxide semiconductor device according to a preferred embodiment of the present invention.

As shown in FIG. 7, a patterned silicon nitride layer (not shown) is formed on the substrate 210. The patterned silicon nitride layer is formed by methods such as etching and lithography process to define the location of the field oxide layer 230. An N-type drain 270' is formed by methods such as lithography process and ion implantation process P1. Then, the field oxide layer 230 is formed by performing an oxidation process using the patterned silicon nitride layer as a mask. The field oxide layer 230 is used for an isolation structure, but the isolation structure is not limited to the field oxide layer 230; it may also be an isolation structure such as a shallow trench isolation (STI). In this case, the field oxide layer 230 is formed in the first deep well 220 and protrudes from the surface of the substrate 210. A P-type first dopant region 260 is formed in the second deep well 250 by performing a lithography process and an ion implantation process P2, wherein the doping concentration of the first dopant region 260 is higher than the doping concentration of the second deep well 250, and thereby a gradual P-type doping concentration structure is formed.

Figure 8:
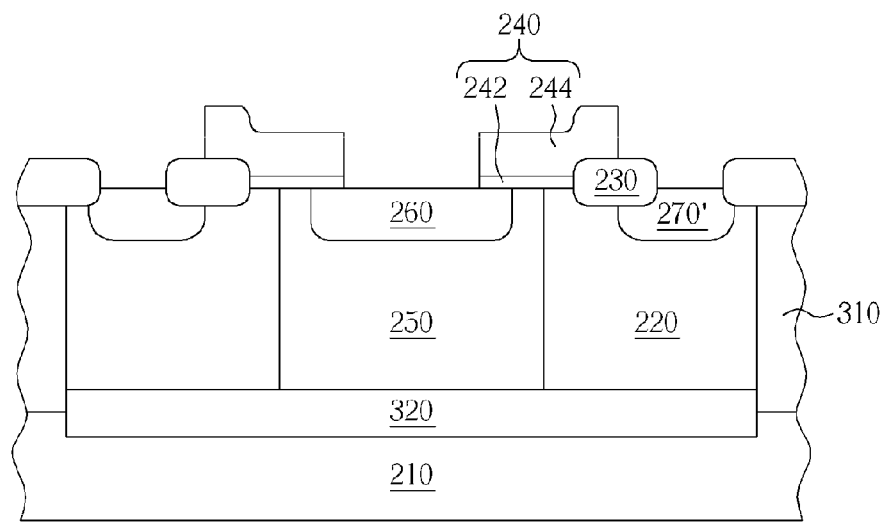
FIG. 8 schematically depicts a cross-sectional view of a fabricating method of a lateral-diffused metal oxide semiconductor device according to a preferred embodiment of the present invention.

As shown in FIG. 8, a gate dielectric layer 242 and a gate electrode 244 are formed on the substrate 210 between the first dopant region 260 and the drain 270'. Then, the gate dielectric layer 242 and the gate electrode 244 are patterned for having a racetrack shaped layout and cover a portion of the field oxide layer 230. The forming methods of the gate dielectric layer 242 and the gate electrode 244 are known in the art, and are therefore not described herein.

Figure 9:
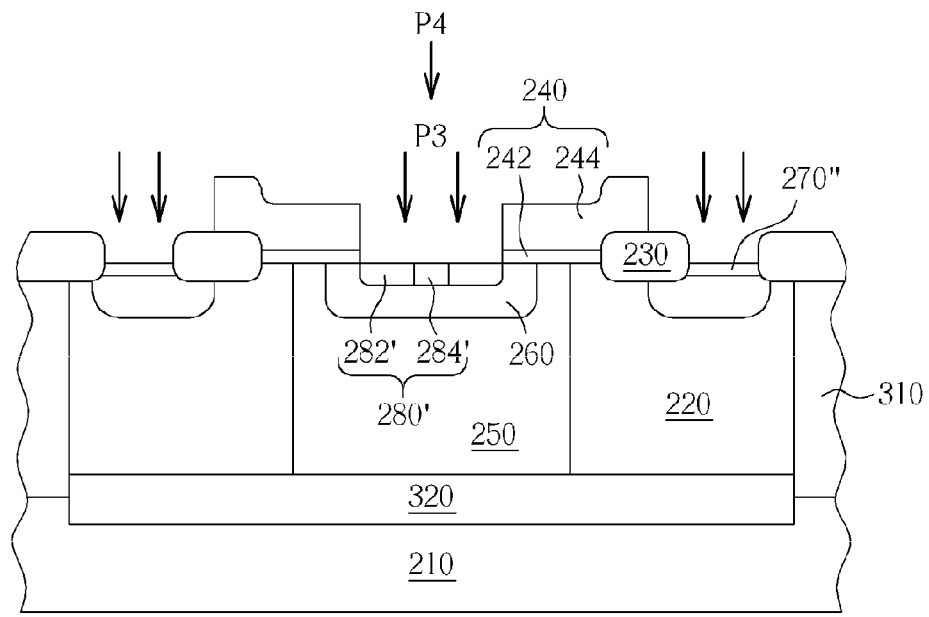
FIG. 9 schematically depicts a cross-sectional view of a fabricating method of a lateral-diffused metal oxide semiconductor device according to a preferred embodiment of the present invention.

As shown in FIG. 9, a drain 270" having an N-typed lightly doped region is formed in the first deep well 220 at one side of the field oxide layer 230 by performing processes such as a lithography process and an ion implantation process P3. At the same time, a common source 280' having an N-type dopant region is formed in the first dopant region 260 at the other side of the field oxide layer 230. Furthermore, a plurality of P-type lightly doped island-shaped third dopant region 284 are formed in the common source 280' by performing a lithography process and an ion implantation process P4, while the portion of the common source 280' not performing the lithography process and the ion implantation process P4 forms an N-type lightly doped second dopant region 282'.

Figure 10:
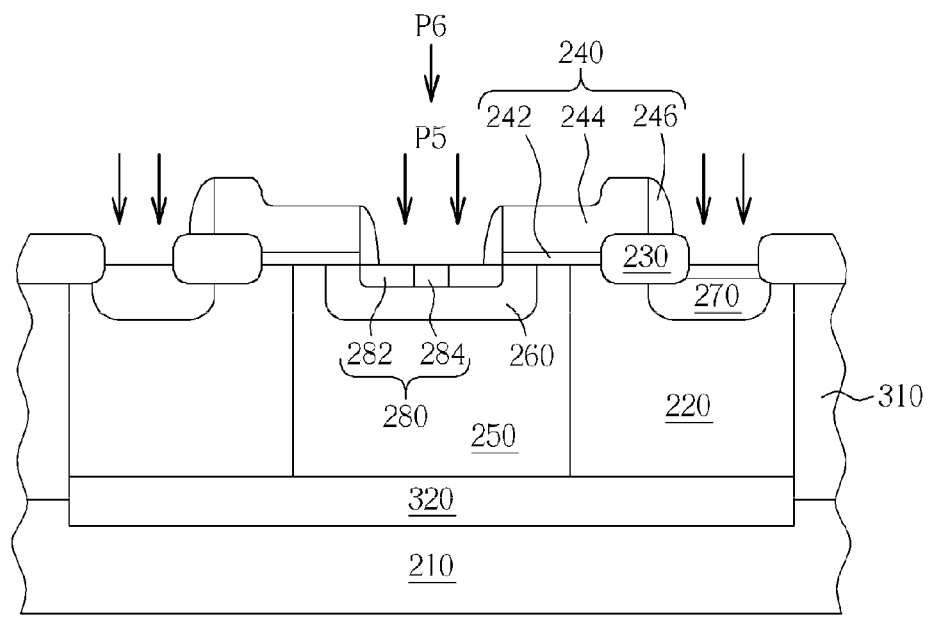
FIG. 10 schematically depicts a cross-sectional view of a fabricating method of a lateral-diffused metal oxide semiconductor device according to a preferred embodiment of the present invention.

As shown in FIG. 10, a spacer 246 is formed surrounding the gate electrode 244 by performing methods such as an etching and a lithography process. Then, a drain 270 having an N-type heavily doped region is formed in the first deep well 220 at one side of the field oxide layer 230 by performing methods such as a lithography process and an ion implantation process P5. Simultaneously, a common source (not shown) having an N-type heavily doped region is formed in the first dopant region 260 at the other side of the field oxide layer 230. A plurality of P-type heavily doped island-shaped third dopant regions 284 are formed in the common source by performing methods such as a lithography process and an ion implantation process P6. At this moment, an N-type heavily doped second dopant region 282 is formed in the portion of the common source not performing the lithography process and the ion implantation process P6, thereby the second dopant region 282 and the island-shaped third dopant region 284 form the common source 280. At this point, the fabricating method of the lateral-diffused metal oxide semiconductor device 200 is finished.

The present invention provides a lateral-diffused metal oxide semiconductor device and fabrication method thereof, which has a second deep well. The dopant type of the second deep well and the dopant type the first dopant region are the same, and the doping concentration of the second deep well is lower than the doping concentration of the first dopant region, thereby the lateral-diffused metal oxide semiconductor device of the present invention has a gradual doping concentration ingredient structure. In this way, the lateral-diffused metal oxide semiconductor device of the present invention can solve the problems of the concentration of electrical field and the bad electrical distribution caused by the different dopant types and the sharp doping profile of the first dopant region and the first deep well. The R/B ratio of the lateral-diffused metal oxide semiconductor device of the present invention is lower than the prior art and the electrical performance of the lateral-diffused metal oxide semiconductor device improves. The lateral-diffused metal oxide semiconductor device of the present invention has an embedded layer used as an insulating layer for avoiding circuit leakage flowing downward from the components above the embedded layer, especially for the second deep well.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lateral-diffused metal oxide semiconductor device, comprising:
   a substrate;
   an epitaxial layer located on the substrate, wherein the epitaxial layer comprises a first deep well having a first conductive type;
   an embedded layer located between the substrate and the epitaxial layer;
   at least a field oxide layer located on the epitaxial layer;
   a gate disposed on the epitaxial layer and covers a portion of the field oxide layer;
   a second deep well having a second conductive type located in the epitaxial layer next to the first deep well;
   a first dopant region having a second conductive type located in the second deep well, wherein the doping concentration of the first dopant region is higher than the doping concentration of the second deep well;
   a drain disposed in the first deep well outside of the gate; and
   a common source disposed in the first dopant region inside of the gate.

2. The lateral-diffused metal oxide semiconductor device according to claim 1, wherein the gate has a racetrack shaped layout.

3. The lateral-diffused metal oxide semiconductor device according to claim 1, wherein the embedded layer comprises a heavily doped region or an N+ embedded layer.

4. The lateral-diffused metal oxide semiconductor device according to claim 2, wherein the interface between the second deep well and the first deep well comprises a racetrack shaped layout surface.

5. The lateral-diffused metal oxide semiconductor device according to claim 4, wherein the interface between the second deep well and the first deep well is located directly below the gate.

6. The lateral-diffused metal oxide semiconductor device according to claim 2, wherein the interface between the first dopant region and the second deep well comprises a racetrack shaped layout surface.

7. The lateral-diffused metal oxide semiconductor device according to claim 1, wherein only the second deep well is disposed between the first deep well and the first dopant region.

8. The lateral-diffused metal oxide semiconductor device according to claim 1, wherein the common source further comprises a second dopant region and a plurality of island-shaped third dopant regions, wherein the second dopant region and the island-shaped third dopant regions are respectively of a first conductive type and a second conductive type.

9. The lateral-diffused metal oxide semiconductor device according to claim 8, wherein the doping concentration of the second deep well, the first dopant region and the island-shaped third dopant regions from high to low is the island-shaped third dopant regions, the first dopant region and the second deep well.

10. A fabricating method of a lateral-diffused metal oxide semiconductor device, comprising:
    providing a substrate;
    forming a first deep well in the substrate, wherein the first deep well is a first conductive type;
    forming a second deep well in the substrate next to the first deep well, wherein the second deep well is a second conductive type;
    forming a drain in the first deep well;
    forming at least a field oxide layer on the substrate;
    forming a first dopant region in the second deep well, wherein the first dopant region is a second conductive type and the doping concentration of the first dopant region is higher than the doping concentration of the second deep well;
    forming a gate on the substrate between the first dopant region and the drain, wherein the gate covers a portion of the field oxide layer; and
    forming a common source disposed in the first dopant region inside of the gate.

11. The fabricating method of the lateral-diffused metal oxide semiconductor device according to claim 10, wherein the gate has a racetrack shaped layout.

12. The fabricating method of the lateral-diffused metal oxide semiconductor device according to claim 10, wherein the substrate comprises a semiconductor substrate and an epitaxial layer formed on the semiconductor substrate, wherein the first deep well is located in the epitaxial layer.

13. The fabricating method of the lateral-diffused metal oxide semiconductor device according to claim 12, wherein the substrate further comprises an embedded layer, and the forming steps of the substrate comprise:
    forming the embedded layer in the semiconductor substrate; and
    forming the epitaxial layer on the semiconductor substrate, wherein the embedded layer contacts the epitaxial layer.

14. The fabricating method of the lateral-diffused metal oxide semiconductor device according to claim 13, wherein the embedded layer is formed by a heavily doped ion implantation process.

15. The fabricating method of the lateral-diffused metal oxide semiconductor device according to claim 10, wherein the steps of forming the common source comprise:
    forming a second dopant region and a plurality of island-shaped third dopant regions, wherein the second dopant region and the island-shaped third dopant regions respectively are of a first conductive type and a second conductive type.

* * * * *